(12) United States Patent
Katayama

(10) Patent No.: US 8,576,533 B2
(45) Date of Patent: Nov. 5, 2013

(54) DISCHARGE GAP DEVICE AND POWER SUPPLY DEVICE

(75) Inventor: Takayuki Katayama, Tama (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 336 days.

(21) Appl. No.: 12/495,846

(22) Filed: Jul. 1, 2009

(65) Prior Publication Data

US 2010/0008008 A1 Jan. 14, 2010

(30) Foreign Application Priority Data

Jul. 8, 2008 (JP) ................................. 2008-178309

(51) Int. Cl.
*H02H 3/22* (2006.01)

(52) U.S. Cl.
USPC ........................................................... 361/120

(58) Field of Classification Search
USPC ........................................................... 361/120
See application file for complete search history.

(56) References Cited

U.S. PATENT DOCUMENTS

| | | | | |
|---|---|---|---|---|
| 4,438,365 | A * | 3/1984 | Atkinson | 313/325 |
| 6,191,928 | B1 * | 2/2001 | Rector et al. | 361/127 |
| 6,366,439 | B1 * | 4/2002 | Yang | 361/120 |
| 2009/0116165 | A1 * | 5/2009 | Tokunaga et al. | 361/220 |

FOREIGN PATENT DOCUMENTS

| | | |
|---|---|---|
| JP | 53-81332 | 7/1978 |
| JP | 04-022086 | 1/1992 |
| JP | 2002-232091 | 8/2002 |

OTHER PUBLICATIONS

Japanese Office Action mailed Apr. 10, 2012.

* cited by examiner

*Primary Examiner* — Jared Fureman
*Assistant Examiner* — Nicholas Ieva
(74) *Attorney, Agent, or Firm* — IPUSA, PLLC

(57) ABSTRACT

A discharge gap device includes a first discharge pattern connected to a first wiring pattern and a second discharge pattern connected to a second wiring pattern which is electrically insulated from the first wiring pattern and the first discharge pattern, the second discharge pattern projecting from the second wiring pattern. The first and second discharge patterns are opposed to each other, and a gap between the first discharge pattern and the second discharge pattern is set to a predetermined interval, so that the discharge gap device discharges a lightning surge or static electricity from the gap. The first discharge pattern includes a first side face which confronts the second discharge pattern, the second discharge pattern includes a second side face which confronts the first side face, and the first side face and the second side face are arranged in parallel.

4 Claims, 7 Drawing Sheets

DISCHARGE GAP DEVICE AND POWER SUPPLY DEVICE

BACKGROUND OF THE INVENTION

1. Field of the Invention

This invention relates to a discharge gap device and a power supply device which are adapted to discharge a lightning surge or static electricity.

2. Description of the Related Art

FIG. 7 is a top view of a discharge gap device according to the related art. In FIG. 7, the arrow F denotes a predetermined gap (which will be called gap F) between the end 201A of a first discharge pattern 201 and the end 202A of a second discharge pattern 202. The gap F is a predetermined interval which is appropriate for discharging a lightning surge or static electricity.

As illustrated in FIG. 7, the discharge gap device 200 according to the related art is a discharge gap pattern for discharging a lightning surge or static electricity, and this discharge gap device 200 includes a first discharge pattern 201 and a second discharge pattern 202.

The first discharge pattern 201 is formed integrally with a first wiring pattern 204. The first discharge pattern 201 includes a pointed edge (which includes a triangular cross-section) and projects from the first wiring pattern 204. The first discharge pattern 201 includes a thickness which is the same as a thickness of the first wiring pattern 204.

The second discharge pattern 202 is formed integrally with a second wiring pattern 205. The second discharge pattern 202 includes a pointed edge (which includes a triangular cross-section), and projects from the second wiring pattern 205. The second discharge pattern 202 includes a thickness which is the same as a thickness of the second wiring pattern 205.

The first and second discharge patterns 201, 202 are arranged so that the end 201A of the first discharge pattern 201 and the end 202A of the second discharge pattern 202 face each other and the gap F between the end 201A and the end 202A is defined.

The above-described discharge gap device 200 is provided for use in a power supply device (refer to FIG. 8).

FIG. 8 is a diagram illustrating the composition of a power supply device including the discharge gap device according to the related art. In FIG. 8, the elements which are the same as corresponding elements illustrated in FIG. 7 are designated by the same reference numerals, and a description thereof will be omitted. For the sake of convenience, a line filter 212 is illustrated by the one-dot chain line in FIG. 8.

As illustrated in FIG. 8, the power supply device 210 includes a substrate 211, two first wiring patterns 204, two second wiring patterns 205, two discharge gap devices 200, a line filter 212, a power supply 213, and an internal circuit 215.

The first and second wiring patterns 204,205 and the discharge gap device 200 are disposed on substrate 211. Each first wiring pattern 204 includes a terminal part 204A to which the terminal of the line filter 212 is connected. Each first wiring pattern 204 is electrically connected to the line filter 212 and the power supply 213.

Each second wiring pattern 205 includes a terminal part 205A to which the terminal of the line filter 212 is connected. Each second wiring pattern 205 is electrically connected to the line filter 212 and the internal circuit 215.

The first and second wiring patterns 204,205 are arranged so that one end of the first wiring pattern 204 confronts one end of the second wiring pattern 205. Each discharge gap device 200 is disposed in the first and second wiring patterns 204,205 where the end of the first wiring pattern 204 confronts the end of the second wiring pattern 205.

The line filter 212 is provided for eliminating noises, and this line filter 212 includes four terminals. The line filter 212 is mounted on the terminal parts 204A and 205A of the first and second wiring patterns 204,205.

The power supply device 210 causes the discharge gap device 200 to discharge a lightning surge or static electricity induced by the energy accumulated in the line filter 212, in order to prevent the breakage of the internal circuit 215. Refer to Japanese Laid-Open Patent Publication No. 2002-232091.

FIG. 9 is a diagram for explaining the problem of the discharge gap device according to the related art. In FIG. 9, the elements which are the same as corresponding elements in FIG. 7 are designated by the same reference numerals, and a description thereof will be omitted.

In the discharge gap device 200 according to the related art, each of the first and second discharge patterns 201,202 includes a pointed edge, and when a repeated discharge operation is performed, the pointed edges of the first and second discharge patterns 201,202 are damaged as illustrated in FIG. 9.

As a result, the gap between the first discharge pattern 201 and the second discharge pattern 202 is enlarged so that it is larger than the predetermined gap F. In such a case, it is impossible for the discharge gap device 200 to discharge the energy resulting from a lightning surge or static electricity.

SUMMARY OF THE INVENTION

In one aspect of the invention, the present disclosure provides an improved discharge gap device in which the above-described problems are eliminated.

In one aspect of the invention, the present disclosure provides a discharge gap device which can maintain the gap between the first discharge pattern and the second discharge pattern at a predetermined interval and can perform repeated electric discharging.

In an embodiment of the invention which solves or reduces one or more of the above-mentioned problems, the present disclosure provides a discharge gap device comprising: a first discharge pattern connected to a first wiring pattern and projecting from the first wiring pattern; and a second discharge pattern connected to a second wiring pattern which is electrically insulated from the first wiring pattern and the first discharge pattern, the second discharge pattern projecting from the second wiring pattern, wherein the first and second discharge patterns are opposed to each other, and a gap between the first discharge pattern and the second discharge pattern is set to a predetermined interval, so that the discharge gap device discharges a lightning surge or static electricity from the gap between the first discharge pattern and the second discharge pattern, wherein the first discharge pattern includes a first side face which confronts the second discharge pattern, the second discharge pattern includes a second side face which confronts the first side face, and the first side face and the second side face are arranged in parallel.

In an embodiment of the invention which solves or reduces one or more of the above-mentioned problems, the present disclosure provides a power supply device comprising: the above-mentioned discharge gap device; a substrate on which the discharge gap device is disposed; a power supply electrically connected to the first wiring pattern of the discharge gap device; an internal circuit electrically connected to the second wiring pattern of the discharge gap device; and a line filter electrically connected to the first and second discharge patterns of the discharge gap device.

In the discharge gap device of the embodiment of the invention, the gap between the first discharge pattern and the second discharge pattern is maintained at a predetermined interval even when repeated electric discharging is performed. It is possible to improve the durability of the discharge gap device.

Other objects, features and advantages of the invention will be apparent from the following detailed description when read in conjunction with the accompanying drawings.

DETAILED DESCRIPTION OF PREFERRED EMBODIMENTS

A description will now be given of embodiments of the invention with reference to the accompanying drawings.

Figure 1:
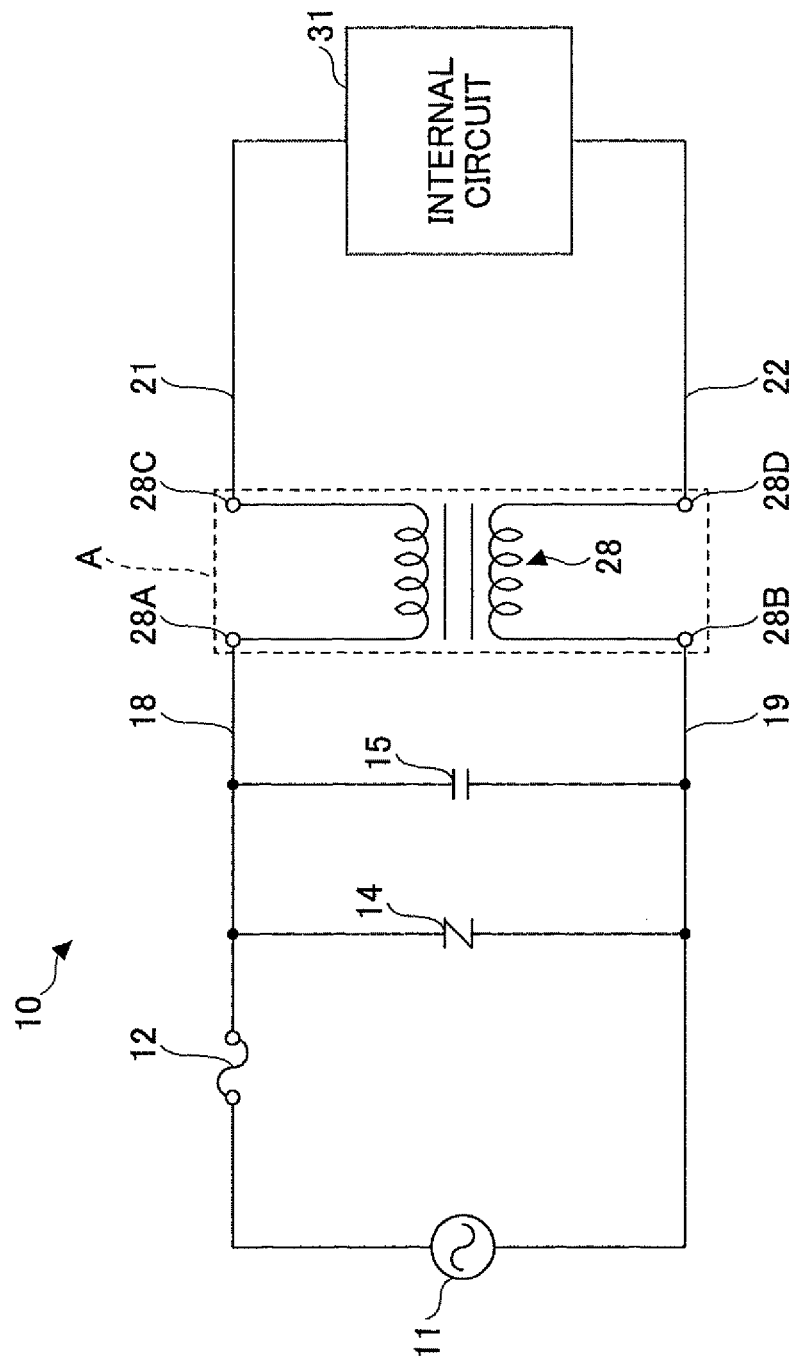
FIG. 1 is a diagram illustrating the composition of a power supply device of an embodiment of the invention.
Figure 2:
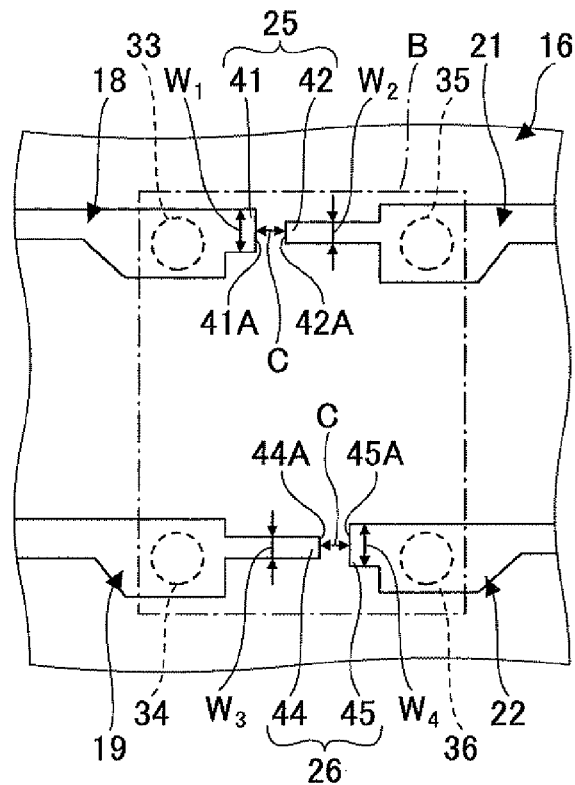
FIG. 2 is a top view of a portion of the power supply device corresponding to an area A illustrated in FIG. 1.

FIG. 1 illustrates the composition of a power supply device of an embodiment of the invention. FIG. 2 is a top view of a portion of the power supply device corresponding to an area indicated by the dotted line A in FIG. 1. In the composition of FIG. 1, it is difficult to illustrate discharge gap devices 25 and 26 as illustrated in FIG. 2, and the illustration thereof is omitted. In FIG. 2, the illustration of a line filter 28 as illustrated in FIG. 1 is omitted, for the sake of convenience. Moreover, in FIG. 2, the one-dot chain line B denotes an area of a substrate 16 on which the line filter 28 is mounted (which area will be called "line filter mounting area B").

As illustrated in FIG. 1 and FIG. 2, the power supply device 10 of this embodiment is a device which generates a DC voltage of a predetermined level from the output of an AC power supply 11. The power supply device 10 includes an AC power supply 11, a fuse 12, a varistor 14, a capacitor 15, a substrate 16, first wiring patterns 18, 19, second wiring patterns 21, 22, discharge gap devices 25, 26, a line filter 28, and an internal circuit 31.

The fuse 12 is connected in series to the AC power supply 11. The varistor 14 is connected in series to the fuse 12. The capacitor 15 is connected in parallel to the varistor 14.

The substrate 16 includes insulating layers, vias, wirings (not illustrated), etc. A printed-circuit board may be used as the substrate 16.

The first wiring pattern 18 is disposed on the substrate 16. The first wiring pattern 18 includes a terminal part 33 (rounded part) to which a terminal 28A (which will be described later) of the line filter 28 is connected. The terminal part 33 is disposed on the substrate 16 in the portion corresponding to the line filter mounting area B.

The first wiring pattern 18 is electrically connected to each of the AC power supply 11, the varistor 14, and one terminal of the capacitor 15.

The first wiring pattern 19 is disposed on the substrate 16. The first wiring pattern 19 includes a terminal part 34 (rounded part) to which a terminal 28B (which will be described later) of the line filter 28 is connected. The terminal part 34 is disposed on the substrate 16 in the portion corresponding to the line filter mounting area B.

The first wiring pattern 19 is electrically connected to each of the AC power supply 11, the varistor 14, and the other terminal of the capacitor 15.

The second wiring pattern 21 is disposed on the substrate 16. The second wiring pattern 21 includes a terminal part 35 (rounded part) to which a terminal 28C (which will be described later) of the line filter 28 is connected. The terminal part 35 is disposed on the substrate 16 in the portion corresponding to the line filter mounting area B.

The second wiring pattern 22 is disposed on the substrate 16. The second wiring pattern 22 includes a terminal part 36 (rounded part) to which a terminal 28D (which will be described later) of the line filter 28 is connected. The terminal part 36 is disposed on the substrate 16 in the portion corresponding to the line filter mounting area B.

The second wiring patterns 21 and 22 are electrically connected to the internal circuit 31.

The discharge gap device 25 is a pattern for discharging a lightning surge or static electricity induced by the energy accumulated in the line filter 28, in order to prevent damaging of the internal circuit 31. The discharge gap device 25 includes a first discharge pattern 41 and a second discharge pattern 42.

The first discharge pattern 41 is disposed on the substrate 16 in the portion corresponding to the line filter mounting area B. The first discharge pattern 41 is formed integrally with the first wiring pattern 18. The first discharge pattern 41 is formed to project from the end of the first wiring pattern 18 in the portion corresponding to the line filter mounting area B.

The first discharge pattern 41 includes a side face 41A (a first side face) which confronts the second discharge pattern 42. The side face 41A is a surface which is perpendicular to the upper surface of the substrate 16. For example, a width W1 of the first discharge pattern 41 in the portion corresponding to the side face 41A (the first side face) may be in a range of 0.1 mm 10 mm. A thickness of the first discharge pattern 41 may be equal to that of the first wiring pattern 21. For example, the thickness of the first discharge pattern 41 may be equal to 18 micrometers.

The second discharge pattern 42 is disposed on the substrate 16 in the portion corresponding to the line filter mounting area B. The second discharge pattern 42 is formed integrally with the second wiring pattern 21. The second discharge pattern 42 is formed to project from the end of the second wiring pattern 21 in the portion corresponding to the line filter mounting area B.

The second discharge pattern 42 includes a side face 42A (a second side face) which confronts the first discharge pattern 41. The side face 42A of the second discharge pattern 42 confronts the side face 41A of the first discharge pattern 41. The first discharge pattern 41 and the second discharge pattern 42 are arranged so that the side face 41A and the side face 42A are substantially parallel to each other.

A predetermined interval C is provided between the side face 41A and the side face 42A. This interval C is a gap which enables the discharge gap device 25 to appropriately discharge a lightning surge or static electricity induced by the energy accumulated in the line filter 28. For example, the predetermined interval C may be equal to 0.1 mm.

A width W2 of the second discharge pattern 42 in the portion corresponding to the side face 42A may be smaller than the width W1 of the first discharge pattern 41. Alternatively, it may be equal to the width W1 of the first discharge pattern 41. Alternatively, it may be larger than the width W1 of the first discharge pattern 41.

For example, as illustrated in FIG. 2, the width W2 of the second discharge pattern 42 is smaller than the width W1 of the first discharge pattern 41. When the width W1 of the first discharge pattern 41 is equal to 3 mm, the width W2 of the second discharge pattern 42 may be equal to 0.5 mm.

A thickness of the second discharge pattern 42 may be equal to that of the second wiring pattern 22. For example, the thickness of the second discharge pattern 42 may be equal to 18 micrometers.

Figure 3:
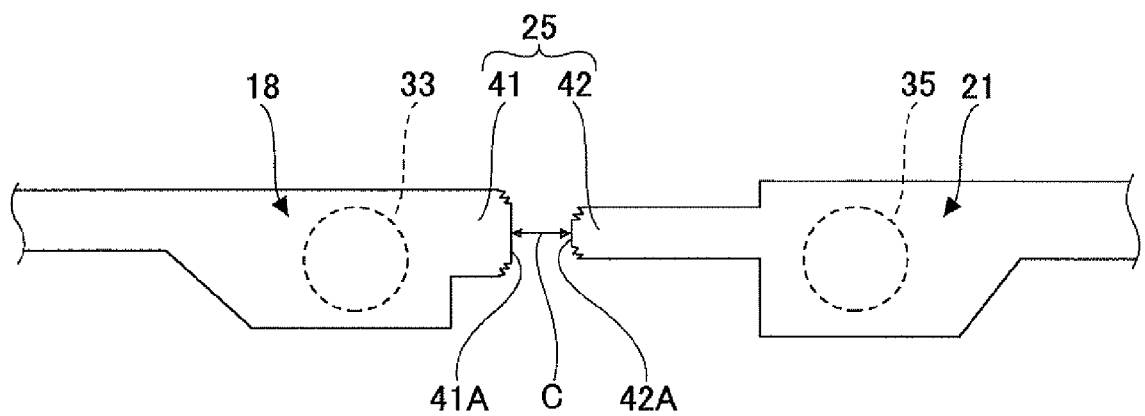
FIG. 3 is a diagram illustrating the state in which the first and second discharge patterns are damaged.

FIG. 3 is a diagram illustrating the state in which the first and second discharge patterns are damaged. In FIG. 3, the state in which the corner parts of the first and second discharge patterns 41 and 42 are damaged by discharging is illustrated.

As described above, the first side face 41A of the first discharge pattern 41 confronts the second discharge pattern 42, the second side face 42A of the second discharge pattern 42 confronts the first discharge pattern 41, and the first side face 41A and the second side face 42A are arranged to be parallel to each other. Even when the corner parts of the first discharge pattern 41 and the second discharge pattern 42 are damaged (FIG. 3), it is possible to maintain the gap between the first discharge pattern 41 and the second discharge pattern 42 at the predetermined interval C. The discharge gap device 25 can repeatedly discharge a lightning surge or static electricity induced by the energy accumulated in the line filter 28.

The first and second discharge patterns 41 and 42 may be configured in the form of a rectangle (refer to FIG. 2) or a trapezoid. In one embodiment of the invention, the first and second discharge patterns 41 and 42 are configured in the form of a rectangle, and the first and second discharge patterns 41 and 42 can be formed easily, when compared with the case in which the first and second discharge patterns 201,202 having the pointed edges are formed.

In the discharge gap device of this embodiment, the first and second discharge patterns 41 and 42 are configured in the form of a rectangle, and the widths W1 and W2 of the first and second discharge patterns 41 and 42 may be adjusted to adjust the operational life of the first and second discharge patterns 41 and 42 without forming a large number of first and second discharge patterns 41 and 42.

As illustrated in FIG. 1 and FIG. 2, the discharge gap device 26 is also a pattern for discharging a lightning surge or static electricity induced by the energy accumulated in the line filter 28, in order to prevent damaging of the internal circuit 31. The discharge gap device 26 includes a first discharge pattern 44 and a second discharge pattern 45.

The first discharge pattern 44 is disposed on the substrate 16 in the portion corresponding to the line filter mounting area B. The first discharge pattern 44 is formed integrally with the first wiring pattern 19. The first discharge pattern 44 is formed to project from the end of the first wiring pattern 19 in the portion corresponding to the line filter mounting area B.

The first discharge pattern 44 includes a side face 44A (a first side face) which confronts the second discharge pattern 45. The side face 44A is a surface which is perpendicular to the upper surface of the substrate 16. For example, a width W3 of the first discharge pattern 44 in the portion corresponding to the side face 44A (the first side face) may be in a range of 0.3 mm-3 mm. A thickness of the first discharge pattern 44 may be equal to that of the first wiring pattern 19. For example, the thickness of the first discharge pattern 44 may be equal to 18 micrometers.

The second discharge pattern 45 is disposed on the substrate 16 in the portion corresponding to the line filter mounting area B. The second discharge pattern 45 is formed integrally with the second wiring pattern 22. The second discharge pattern 45 is formed to project from the end of the second wiring pattern 22 in the portion corresponding to the line filter mounting area B.

The second discharge pattern 45 includes a side face 45A (a second side face) which confronts the first discharge pattern 44. The side face 45A of the second discharge pattern 45 confronts the side face 44A of the first discharge pattern 44. The first discharge pattern 44 and the second discharge pattern 45 are arranged so that the side face 44A and the side face 45A are substantially parallel to each other.

The predetermined interval C is provided between the side face 44A and the side face 45A. This interval C is a gap which enables the discharge gap device 26 to appropriately discharge a lightning surge or static electricity induced by the energy accumulated in the line filter 28.

A width W4 of the second discharge pattern 45 in the portion corresponding to the side face 45A may be smaller than the width W3 of the first discharge pattern 44. Alternatively, it may be equal to the width W3 of the first discharge pattern 44. Alternatively, it may be larger than the width W3 of the first discharge pattern 44.

For example, as illustrated in FIG. 2, the width W4 of the second discharge pattern 45 is larger than the width W3 of the first discharge pattern 44. When the width W3 of the first discharge pattern 44 is equal to 0.3 mm, the width W4 of the second discharge pattern 45 may be equal to 5 mm.

A thickness of the second discharge pattern 45 may be equal to that of the second wiring pattern 22. For example, the thickness of the second discharge pattern 45 may be equal to 18 micrometers.

As described above, the first side face 44A of the first discharge pattern 44 confronts the second discharge pattern 45, the second side face 45A of the second discharge pattern 45 confronts the first discharge pattern 44, and the first side face 44A and the second side face 45A are arranged to be parallel to each other. Even when the corner parts of the first discharge pattern 44 and the second discharge pattern 45 are damaged, it is possible to maintain the gap between the first discharge pattern 44 and the second discharge pattern 45 at the predetermined interval C. The discharge gap device 26 can repeatedly discharge a lightning surge or static electricity induced by the energy accumulated in the line filter 28.

The first and second discharge patterns 44 and 45 may be configured in the form of a rectangle (refer to FIG. 2) or a trapezoid. In one embodiment of the invention, the first and second discharge patterns 44 and 45 are configured in the form of a rectangle, and the first and second discharge patterns 44 and 45 can be formed easily, when compared with the case in which the first and second discharge patterns 201,202 having the pointed edges are formed.

In the discharge gap device of this embodiment, the first and second discharge patterns 44 and 45 are configured in the form of a rectangle, and the widths W3 and W4 of the first and second discharge patterns 44 and 45 may be adjusted to adjust the operational life of the first and second discharge patterns 44 and 45 without forming a large number of first and second discharge patterns 44 and 45.

The line filter 28 includes four terminals 28A-28D. The line filter 28 is connected at the terminals 28A-28D to the terminal parts 33-36 respectively. Hence, the terminal 28A is electrically connected to the first wiring pattern 18, and the terminal 28B is electrically connected to the first wiring pattern 19. The terminal 28C is electrically connected to the second wiring pattern 21, and the terminal 28D is electrically connected to the second wiring pattern 22. In other words, the line filter 28 is electrically connected to the first and second wiring patterns 18, 19, 21, 22.

The internal circuit 31 is electrically connected to the second wiring patterns 21 and 22. For example, the internal circuit 31 may include an AC/DC converter and a control unit to control the AC/DC converter.

In the power supply device 10 of this embodiment, the discharge gap device 25 includes the first and second discharge patterns 41 and 42 in which the side face 41A and the side face 42A confront each other and are arranged to be parallel to each other, and the discharge gap device 26 includes the first and second discharge patterns 44 and 45 in which the side face 44A and the side face 45A confront each other and are arranged to be parallel to each other. It is possible to repeatedly discharge a lightning surge or static electricity induced by the energy accumulated in the line filter 28, and thereby prevent the damaging of the internal circuit 31 electrically connected to the line filter 28.

Figure 4:
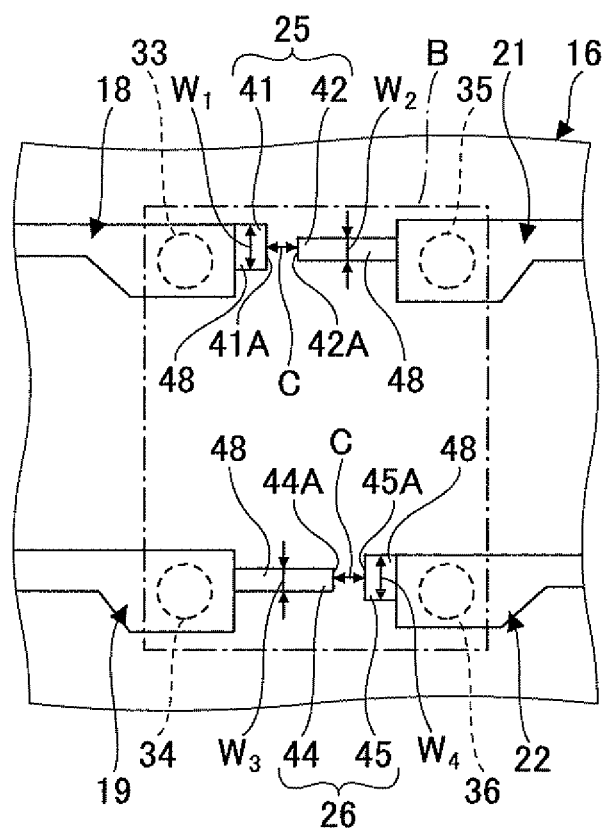
FIG. 4 is a diagram illustrating the composition of a discharge gap device in which a conductive member is disposed.

FIG. 4 is a diagram illustrating the composition of a discharge gap device in which a conductive member is disposed. In FIG. 4, the elements which are the same as corresponding elements in FIG. 2 are designated by the same reference numerals, and a description thereof will be omitted.

As illustrated in FIG. 4, an upper surface of the first and second discharge patterns 41 and 42 which constitute the discharge gap device 25, and an upper surface of the first and second discharge patterns 44 and 45 which constitute the discharge gap device 26 may be covered by a conductive member 48.

An example of a material of the conductive member 48 may include a solder, a conductive paste (e.g., silver paste), etc. When a solder is used as the material of the conductive member 48, a thickness of the conductive member 48 may be equal to 0.5 mm.

In this embodiment, the upper surfaces of the first and second discharge patterns 41, 42, 44, 46 are covered by the conductive member 48, and it is possible to prevent damaging of the first and second discharge patterns 41, 42, 44, 46 more reliably. It is possible to further increase the operational life of the discharge gap device 25 and 26.

Figure 5:
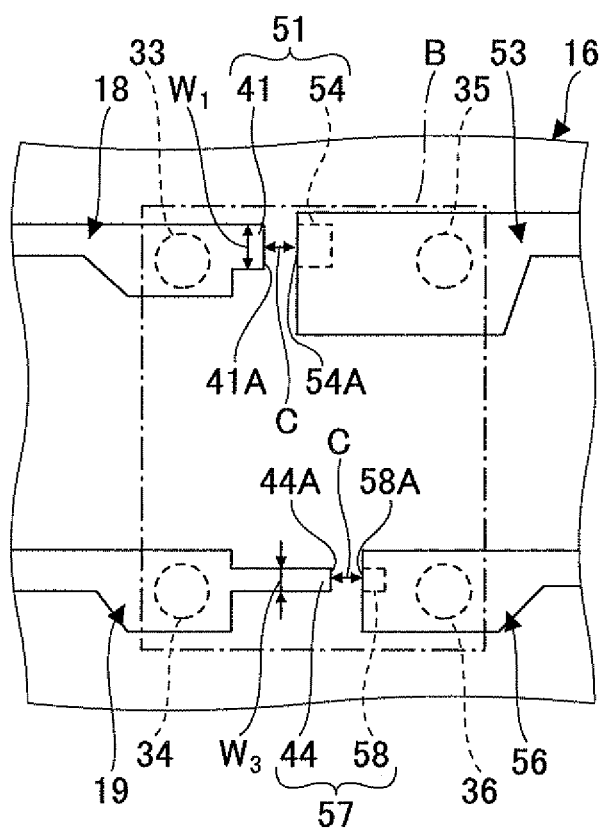
FIG. 5 is a diagram illustrating the composition of a discharge gap device of a first modification of the embodiment of the invention.
Figure 6:
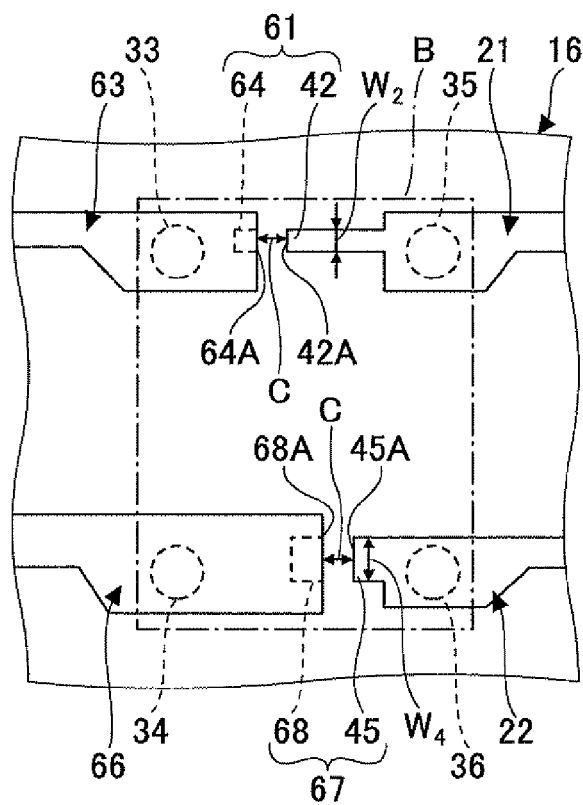
FIG. 6 is a diagram illustrating the composition of a discharge gap device of a second modification of the embodiment of the invention.
Figure 7:
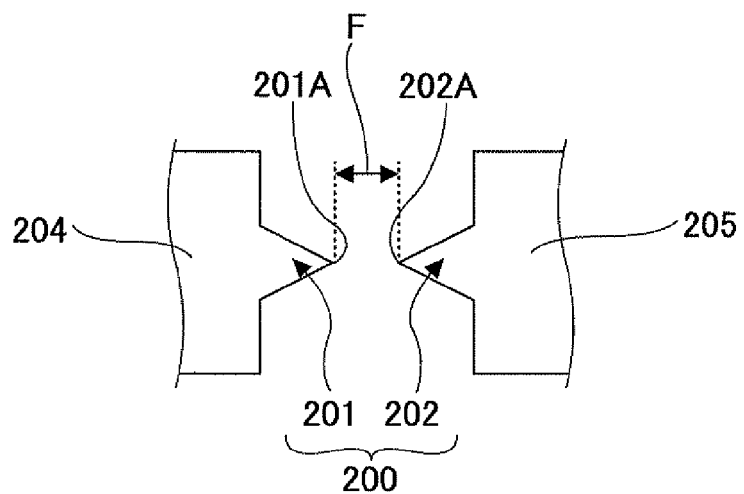
FIG. 7 is a top view of a discharge gap device according to the related art.
Figure 8:
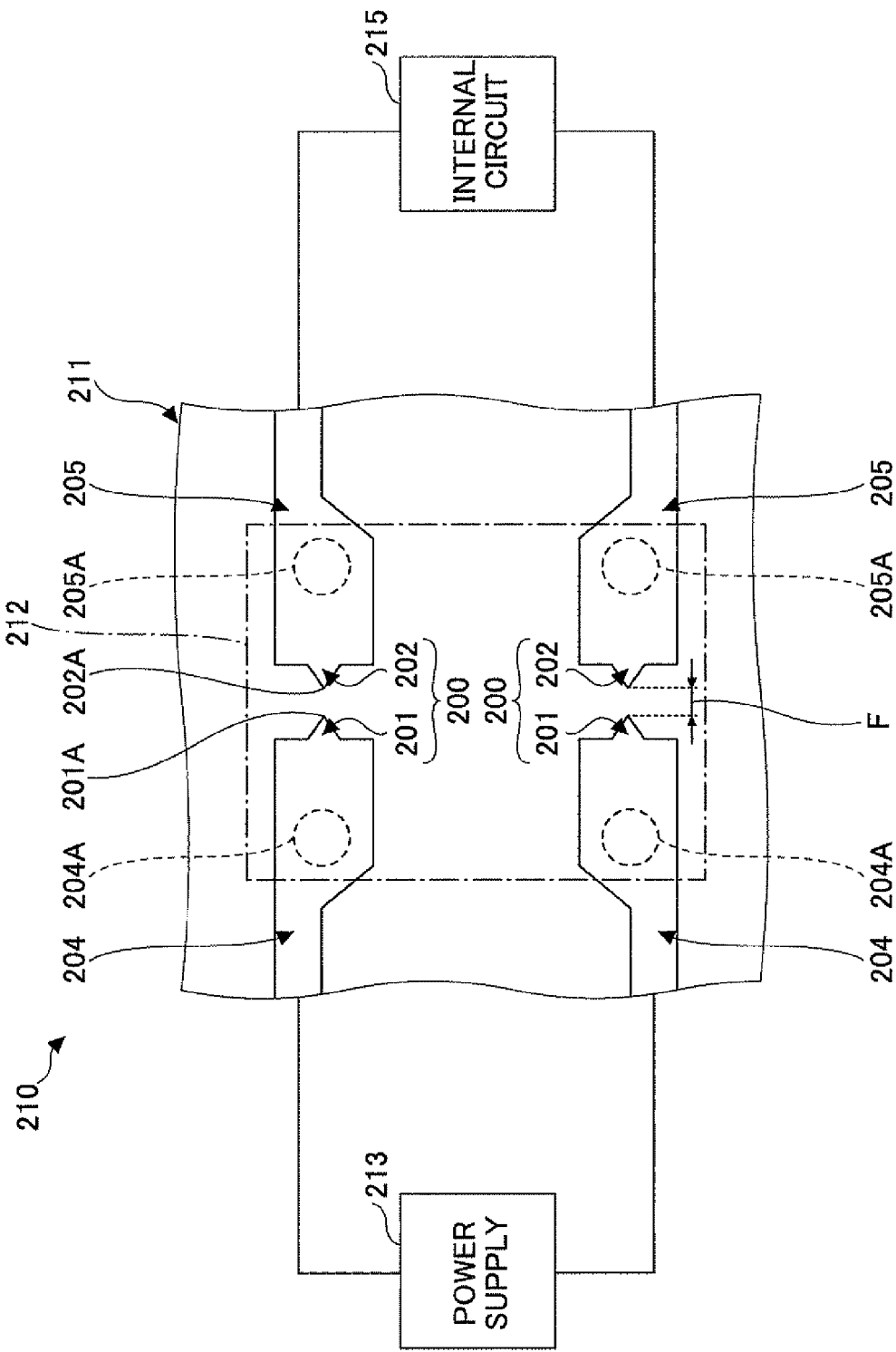
FIG. 8 is a diagram illustrating the composition of a power supply device including the discharge gap device according to the related art.
Figure 9:
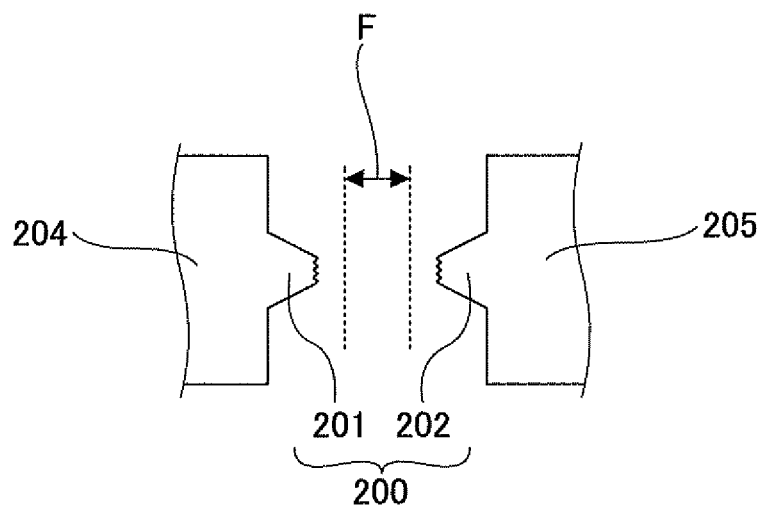
FIG. 9 is a diagram for explaining the problem of the discharge gap device according to the related art.

Alternatively, the discharge gap devices 51, 57, 61 and 67 as illustrated in FIG. 5 and FIG. 6 (which will be described below) may be arranged in the power supply device 10 instead of the discharge gap devices 25 and 26 of FIG. 2 or the discharge gap devices 25 and 26 in which the conductive member 48 is disposed as illustrated in FIG. 4. In this case, the same advantages as in the case in which the discharge gap devices 25 and 26 are arranged in the power supply device 10 can be provided.

FIG. 5 is a diagram illustrating the composition of a discharge gap device of a first modification of the embodiment of FIG. 2. In FIG. 5, the elements which are the same as corresponding elements in FIG. 2 are designated by the same reference numerals, and a description thereof will be omitted.

As illustrated in FIG. 5, the discharge gap device 51 includes the first discharge pattern 41 (which is the same as illustrated in FIG. 2), and a second wiring pattern 53 having a terminal part 35 and a discharge area 54. A thickness of the second wiring pattern 53 is the same as that of the second wiring pattern 21 as illustrated in FIG. 2. The second wiring pattern 53 is electrically insulated from the first wiring pattern 18 and the first discharge pattern 41.

A width of the portion of the second wiring pattern 53 which confronts the first discharge pattern 41 is enlarged to be larger than the width W1 of the first discharge pattern 41. The discharge area 54 is the portion of the second wiring pattern 53 which confronts the side face 41A (discharge side face) of the first discharge pattern 41. Namely, the discharge gap device 51 uses the portion of the second wiring pattern 53 as a discharge pattern.

The predetermined interval C is provided between a side face 54A of the second wiring pattern 53 in the portion corresponding to the discharge area 54 and the side face 41A of the first discharge pattern 41. The side face 54A of the second wiring pattern 53 in the portion corresponding to the discharge area 54 is arranged so that the side face 54A is substantially parallel to the side face 41A of the first discharge pattern 41.

In this embodiment, the first discharge pattern 41 and the discharge area 54 are arranged to maintain the gap between the first discharge pattern 41 and the portion of the second wiring pattern 53 corresponding to the discharge area 54 at the predetermined interval C. The side face 41A of the first discharge pattern 41 and the side face 54A of the second wiring pattern 53 in the portion corresponding to the discharge area 54 are parallel to each other. Hence, it is possible to maintain the gap between the first discharge pattern 41 and the second wiring pattern 53 in the portion corresponding to the discharge area 54 at the predetermined interval C even when the corner parts of the first discharge pattern 41 and the second wiring pattern 53 in the portion corresponding to the discharge area 54 are damaged. It is possible to repeatedly discharge a lightning surge or static electricity induced by the energy accumulated in the line filter 28.

The discharge gap device 57 includes the first discharge pattern 44 (which is the same as illustrated in FIG. 2), and a second wiring pattern 56 having a terminal part 36 and a discharge area 58. A thickness of the second wiring pattern 56 is the same as that of the second wiring pattern 22. The second wiring pattern 56 is electrically insulated from the first wiring pattern 19 and the first discharge pattern 44.

A width of the portion of the second wiring pattern 56 which confronts the first discharge pattern 44 is enlarged to be larger than the width W3 of the first discharge pattern 44. The discharge area 58 is the portion of the second wiring pattern 56 which confronts the side face 44A (discharge side face) of the first discharge pattern 44. Namely, the discharge gap device 57 uses the portion of the second wiring pattern 56 as a discharge pattern.

The predetermined interval C is provided between a side face 58A of the second wiring pattern 56 in the portion corresponding to the discharge area 58 and the side face 44A of the first discharge pattern 44. The side face 58A of the second wiring pattern 56 in the portion corresponding to the discharge area 58 is arranged so that the side face 58A is substantially parallel to the side face 44A of the first discharge pattern 44.

In this embodiment, the first discharge pattern 44 and the discharge area 58 are arranged to maintain the gap between the first discharge pattern 44 and the portion of the second wiring pattern 56 corresponding to the discharge area 58 at the predetermined interval C. The side face 44A of the first discharge pattern 44 and the side face 58A of the second wiring pattern 56 in the portion corresponding to the discharge area 58 are parallel to each other. Hence, it is possible to maintain the gap between the first discharge pattern 44 and the second wiring pattern 56 in the portion corresponding to the discharge area 58 at the predetermined interval C even when the corner parts of the first discharge pattern 44 and the second wiring pattern 56 in the portion corresponding to the discharge area 58 are damaged. It is possible to repeatedly discharge a lightning surge or static electricity induced by the energy accumulated in the line filter 28.

Similar to the previous embodiment of FIG. 4, an upper surface of the first discharge pattern 41 or 44, an upper surface of the portion of the second wiring pattern 56 corresponding to the discharge area 58, and an upper surface of the portion of the second wiring pattern 53 corresponding to the discharge area 54 may be covered by the conductive member 48 as illustrated in FIG. 4.

FIG. 6 is a diagram illustrating the composition of a discharge gap device of a second modification of the embodiment of FIG. 2. In FIG. 6, the elements which are the same as corresponding elements in FIG. 2 are designated by the same reference numerals, and a description thereof will be omitted.

As illustrated in FIG. 6, the discharge gap device 61 includes the second discharge pattern 42 (which is the same as illustrated in FIG. 2) and a first wiring pattern 63 having a terminal part 33 and a discharge area 64. A thickness of the first wiring pattern 63 is the same that of the first wiring pattern 18 as illustrated in FIG. 2. The first wiring pattern 63 is electrically insulated from the second wiring pattern 21 and the second discharge pattern 42.

A width of the portion of the first wiring pattern 63 which confronts the second discharge pattern 42 is enlarged to be larger than the width W2 of the second discharge pattern 42. The discharge area 64 is the portion of the first wiring pattern 63 which confronts the side face 42A (discharge side face) of the second discharge pattern 42. Namely, the discharge gap device 61 uses the portion of the first wiring pattern 63 as a discharge pattern.

The predetermined interval C is provided between a side face 64A of the first wiring pattern 63 in the portion corresponding to the discharge area 64 and the side face 42A of the second discharge pattern 42. The side face 64A of the first wiring pattern 63 in the portion corresponding to the discharge area 64 is arranged so that the side face 64A is substantially parallel to the side face 42A of the second discharge pattern 42.

In this embodiment, the second discharge pattern 42 and the discharge area 64 are arranged to maintain the gap between the first wiring pattern 63 and the portion of the second discharge pattern 42 corresponding to the discharge area 64 at the predetermined interval C. The side face 42A of the second discharge pattern 42 and the side face 64A of the first wiring pattern 63 in the portion corresponding to the discharge area 64 are parallel to each other. Hence, it is possible to maintain the gap between the second discharge pattern 42 and the first wiring pattern 63 in the portion corresponding to the discharge area 64 at the predetermined interval C even when the corner parts of the second discharge pattern 42 and the first wiring pattern 63 in the portion corresponding to the discharge area 64 are damaged. It is possible to repeatedly discharge a lightning surge or static electricity induced by the energy accumulated in the line filter 28.

The discharge gap device 67 includes the second discharge pattern 45 (which is the same as illustrated in FIG. 2), and a first wiring pattern 66 having a terminal part 34 and a discharge area 68. A thickness of the first wiring pattern 66 is the same as that of the second wiring pattern 22 as illustrated in FIG. 2. The first wiring pattern 66 is electrically insulated from the second wiring pattern 22 and the second discharge pattern 45.

A width of the portion of the first wiring pattern 66 which confronts the second discharge pattern 45 is enlarged to be larger than the width W4 of the second discharge pattern 45. The discharge area 68 is the portion of the first wiring pattern 66 which confronts the side face 45A (discharge side face) of the second discharge pattern 45. Namely, the discharge gap device 67 uses the portion of the first wiring pattern 66 as a discharge pattern.

The predetermined interval C is provided between a side face 68A of the first wiring pattern 66 in the portion corresponding to the discharge area 68 and the side face 45A of the second discharge pattern 45. The side face 68A of the first wiring pattern 66 in the portion corresponding to the discharge area 68 is arranged so that the side face 68A is substantially parallel to the side face 45A of the second discharge pattern 45.

In this embodiment, the second discharge pattern 45 and the discharge area 68 are arranged to maintain the gap between the second discharge pattern 45 and the portion of the first wiring pattern 66 corresponding to the discharge area 68 at the predetermined interval C. The side face 45A of the second discharge pattern 45 and the side face 68A of the first wiring pattern 66 in the portion corresponding to the discharge area 68 are parallel to each other. Hence, it is possible to maintain the gap between the second discharge pattern 45 and the first wiring pattern 66 in the portion corresponding to the discharge area 68 at the predetermined interval C even when the corner parts of the second discharge pattern 45 and the first wiring pattern 66 in the portion corresponding to the discharge area 68 are damaged. It is possible to repeatedly discharge a lightning surge or static electricity induced by the energy accumulated in the line filter 28.

Similar to the previous embodiment of FIG. 4, an upper surface of the second discharge pattern 42 or 45, an upper surface of the portion of the first wiring pattern 63 corresponding to the discharge area 64, and an upper surface of the portion of the first wiring pattern 66 corresponding to the discharge area 68 may be covered by the conductive member 48 as illustrated in FIG. 4.

As described in the foregoing, in the discharge gap device of the embodiment of the invention, the gap between the first discharge pattern and the second discharge pattern is maintained at a predetermined interval even when repeated electric discharging is performed. It is possible to improve the durability of the discharge gap device.

The present invention is not limited to the above-described embodiments, and variations and modifications may be made without departing from the scope of the invention. For example, the discharge gap device may be arranged by combining any of the first discharge patterns 41 and 44, the second discharge patterns 42 and 45, the first wiring patterns 63 and 66, and the second wiring patterns 53 and 56 in the above-described embodiments. Moreover, any of the discharge gap devices 25, 26, 51, 57, 61 and 67 in the above-described embodiments may be arranged between the primary terminal and the secondary terminal of the power supply device 10.

The present application is based on Japanese patent application No. 2008-178309, filed on Jul. 8, 2008, the contents of which are incorporated herein by reference in their entirety.

What is claimed is:

1. A power supply device comprising:
 a discharge gap device which discharges a lightning surge or static electricity, said discharge gap device comprising:
 a first wiring pattern including a discharge area; and
 a discharge pattern connected to a second wiring pattern electrically connected to an internal circuit side and projecting from the second wiring pattern, the discharge pattern confronting a portion of the first wiring pattern corresponding to the discharge area, and the discharge pattern being electrically insulated from the first wiring pattern, wherein a gap is formed between the portion of the first wiring pattern corresponding to the discharge area and the discharge pattern to have a predetermined interval therebetween and used to discharge a lighting surge or static electricity, wherein the portion of the first wiring pattern corresponding to the discharge area includes a side face which confronts the discharge pattern, the discharge pattern includes a discharge side face which confronts the side face of the portion of the first wiring pattern, and the discharge side face of the discharge pattern and the side face of the first wiring pattern are arranged to be parallel to each other, wherein the discharge pattern is in a rectangular form with angular edges, and wherein a width of the side face of the first wiring pattern is larger than a width of the discharge side face of the discharge pattern, wherein the discharge area is integrated into the first wiring pattern so as not to project from the side face of the first wiring pattern; and wherein the power supply device further comprises:
a power supply electrically connected to the first wiring pattern of the discharge gap device;
an internal circuit electrically connected to the second wiring pattern of the discharge gap device; and
a line filter electrically connected to the discharge area and the discharge pattern of the discharge gap device.

2. The power supply device according to claim 1, wherein each of the angular edges is substantially perpendicular.

3. The power supply device according to claim 1, wherein the discharge gap device is configured to discharge a lightning surge or static electricity accumulated in the line filter to protect the internal circuit.

4. The power supply device according to claim 1, wherein a conductive member is disposed on an upper surface of each of the discharge pattern and the portion of the first wiring pattern corresponding to the discharge area.

* * * * *